United States Patent
Figuli et al.

(10) Patent No.: US 11,099,602 B2
(45) Date of Patent: Aug. 24, 2021

(54) FAULT-TOLERANT CLOCK GATING

(71) Applicant: International Business Machines Corporation, Armonk, NY (US)

(72) Inventors: Razvan Peter Figuli, Remchingen (DE); Cedric Lichtenau, Stuttgart (DE); Stefan Payer, Stuttgart (DE); Michael Klein, Schoenaich (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 297 days.

(21) Appl. No.: 16/398,793

(22) Filed: Apr. 30, 2019

(65) Prior Publication Data
US 2020/0348718 A1 Nov. 5, 2020

(51) Int. Cl.
*G06F 1/14* (2006.01)
*H03K 21/10* (2006.01)
*H03K 19/20* (2006.01)

(52) U.S. Cl.
CPC ............ *G06F 1/14* (2013.01); *H03K 19/20* (2013.01); *H03K 21/10* (2013.01)

(58) Field of Classification Search
CPC ........... G06F 1/14; H03K 21/10; H03K 19/20
USPC ....................................................... 713/502
See application file for complete search history.

(56) References Cited

U.S. PATENT DOCUMENTS

| | | | | |
|---|---|---|---|---|
| 4,644,498 | A * | 2/1987 | Bedard | G06F 11/187 327/292 |
| 6,098,195 | A * | 8/2000 | Northcott | G06F 11/076 713/502 |
| 10,891,171 | B2 * | 1/2021 | Pan | G06F 9/4856 |
| 2014/0317434 | A1 * | 10/2014 | Chalasani | H04L 25/0276 713/502 |
| 2016/0062389 | A1 * | 3/2016 | Chang | G06F 1/24 713/502 |
| 2017/0038791 | A1 * | 2/2017 | Park | G06F 13/24 |
| 2017/0244392 | A1 | 8/2017 | Stevens et al. | |
| 2018/0164846 | A1 * | 6/2018 | Zerwick | G06F 9/45504 |
| 2019/0044511 | A1 | 2/2019 | Hsu et al. | |

* cited by examiner

*Primary Examiner* — Ryan Jager
(74) *Attorney, Agent, or Firm* — Cantor Colburn LLP; Steven Chiu

(57) ABSTRACT

A method includes obtaining a trigger signal directed to a component in a subset of components of an electronic circuit, and activating a clock corresponding with the subset of components of the electronic circuit for a preliminary period in response to the trigger signal. An active period is determined based on the trigger signal. The clock remains active for the active period. One of a timer or counter is initiated for the active period. A limit is defined for the one of the timer or counter. The active period is dynamically extended for a busy period after the one of the timer or counter is initiated. The clock is deactivated following the active period.

20 Claims, 5 Drawing Sheets

FAULT-TOLERANT CLOCK GATING

BACKGROUND

The present invention relates to integrated circuits, and more specifically, to fault-tolerant clock gating.

Integrated circuits or chips represent a collection of logic gates, buffers, and other circuit elements used to implement the functionality of a processor or other electronic device. Clock gating is a technique for saving power by disabling portions of the circuitry or, stated another way, enabling portions of circuitry only for a certain period. In the disabled portions, flip-flops do not have to switch states and switching power consumption is eliminated. Functional clock gating is an existing clock gating approach that refers to deactivating the clock in a region (i.e., disabling the region) based on a particular function being executed. This approach is not effective for areas (e.g., error reporting mechanisms) that cannot be associated with any particular function or areas that are de-centralized and, therefore, require a large number of clock buffers. Additionally, a functional clock gating approach is susceptible to being triggered accidentally or erroneously. For example, functional clock gating can be susceptible to the effects of radiation (e.g., alpha particles).

SUMMARY

Embodiments of the present invention are directed to systems and methods. A method includes obtaining a trigger signal directed to a component in a subset of components of an electronic circuit, and activating a clock corresponding with the subset of components of the electronic circuit for a preliminary period in response to the trigger signal. The method also includes determining an active period based on the trigger signal. The clock remains active for the active period. One of a timer or counter is initiated for the active period. A limit is defined for the one of the timer or counter. The active period is dynamically extended for a busy period after the one of the timer or counter is initiated. The clock is deactivated following the active period.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIGS. 2-4 detail aspects of an exemplary clock gating circuit that implements the process flow shown in FIG. 1, in which:

FIG. 2 details an exemplary trigger module and preliminary module of an exemplary clock gating circuit;

FIG. 3 details an exemplary count and encode module and dynamic extension module of an exemplary clock gating circuit;

FIG. 4 details an exemplary clock activation and deactivation module of an exemplary clock gating circuit.

DETAILED DESCRIPTION

As previously noted, clock gating is a power saving technique that facilitates disabling of portions of an electronic device for periods when they are not needed (i.e., only enabling when they are needed). Functional clock gating is an approach that poses challenges for regions that cannot be disabled based on a specific function, regions that are too scattered, or vital logic that cannot be left susceptible to accidental or erroneous disabling due to radiation, for example. Embodiments of the invention relate to fault-tolerant clock gating. Specifically, a trigger signal activates a clock for a preliminary clock gate period while the period of a timer or limit of a counter is determined and started. The clock is deactivated after the timer period or counter limit is reached, but the active phase when the clock is active can be dynamically extended (i.e., the timer or counter can be paused) for busy phases. Further, a buffer period can be set following the end of a busy phase (i.e., the active phase can be extended for a defined period). Thus, embodiments of the invention facilitate increased control over the clock gating process and prevent the accidental or erroneous deactivation of a clock.

Figure 1:
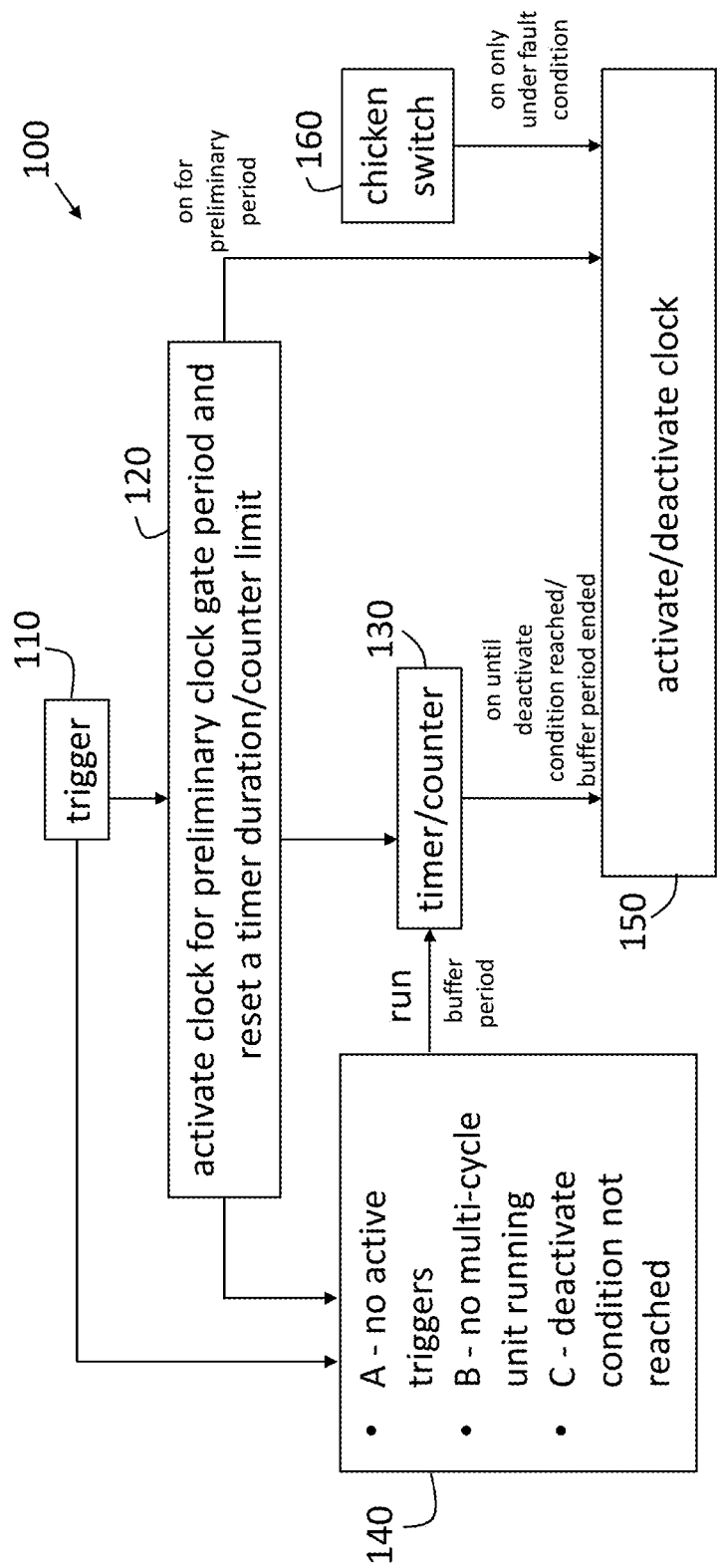
FIG. 1 is a process flow of a method of implementing fault-tolerant clock gating according to one or more embodiments of the invention.

FIG. 1 is a process flow 100 of a method of implementing fault-tolerant clock gating according to one or more embodiments of the invention. The process flow 100 may be performed in a particular unit (e.g., vector floating point unit (VFU), fixed point unit (FXU)) or other subset of the integrated circuit. At block 110, a trigger is received. The specific signal or signals that trigger clock activation are defined for a given unit in which the process flow 100 is implemented. At block 120, activating the clock for a preliminary clock gate period (e.g., 3 clock cycles) and resetting a timer duration or counter limit is initiated by the trigger. The specific trigger (i.e., the operation being executed) can determine the timer duration or counter limit rather than having a fixed timer duration or counter limit. Once the timer duration or counter limit is determined, the timer or counter is initiated, at block 130.

The trigger (at block 110) is also provided to the process at block 140 that controls whether the timer or counter continue to run or are paused. That is, the timer or counter, at block 130, can control the active period of the clock (i.e., the period during which the clock is active), but the factors at block 140 can dynamically extend that active period. Specifically, at block 140, three conditions are checked to determine whether the timer or counter, at block 130, should be allowed to continue or should instead be paused such that the timer duration or counter limit is not reached. The three conditions are that there cannot be any active triggers (at block 110), there cannot be a multi-cycle operation running, and the deactivate condition cannot have been reached. An active trigger refers to any one of the predefined trigger signals being high. A multi-cycle operation refers to one in which an instruction is broken up into multiple steps, each of which requires some number of clock cycles. A divide operation within a VFU is an example of a multi-cycle operation. Thus, when a multi-cycle operation is executing, the timer or counter does not continue to run, at block 130. A deactivate condition being reached refers to the timer or counter, at block 130, reaching the set limit (i.e., the timer duration or the counter limit).

When the three conditions are met at block 140, the timer or counter, at block 130, is allowed to progress unimpeded. For example, a run signal can be applied to enable the timer or counter, at block 130, as shown in FIG. 1. Alternately, the timer or counter, at block 130, can be enabled as a default and the check at block 140 may result in a disable signal being provided to the timer or counter, at block 130, when any one of the three conditions is not met. According to either embodiment, the timer or counter not being enabled (or being disabled) results in a pause of a dynamic duration that is controlled at block 140.

At block 150, activating or deactivating the clock is based on three inputs. Any one of the inputs can activate the clock. When the preliminary clock gate period is initiated, at block 120, an "on" signal is provided to block 150 to activate the clock. This signal is only on for the preliminary clock gate period (e.g., three clock cycles). Thus, if an "on" signal from block 130 or from block 160 is not received at block 150 when the preliminary clock gate period ends, the clock is deactivated after the preliminary clock gate period.

The timer or counter, at block 130, provides an "on" signal to block 150 until a deactivate condition is reached (i.e., until the predefined timer duration or counter limit is reached). As previously noted, this period during which block 130 provides an "on" signal to block 150 can be dynamically extended by block 140. Specifically, the tolling by the timer or counter, at block 130, can be paused based on the determination at block 140. Additionally, as indicated by FIG. 1, an optional buffer period may be added such that the clock active period is extended by a defined duration (e.g., four clock cycles) after conditions to deactivate the clock have been reached at block 130. The buffer period is associated with a multi-cycle operation.

Figure 5:
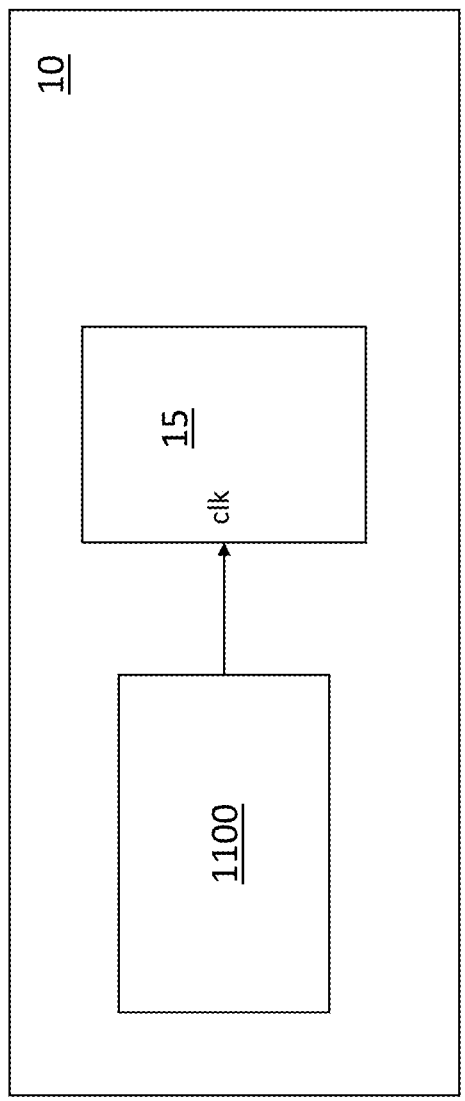
FIG. 5 is a block diagram of a processor that includes the exemplary clock gating circuit according to one or more embodiments of the invention.

At block 160, a chicken switch (CSW) may be activated. A CSW refers to a reconfigurable override and, as indicated, can be configured to provide an "on" signal to block 150 under a fault condition. This fault condition may occur under different circumstances. For example, there may be a manufacturing fault that is uncovered during testing prior to deployment in a processor 10 (FIG. 5). In this case, the CSW is configured to always provide an "on" signal to block 150, because the power inefficiency of leaving the clock active at all times is preferable to not having an active clock when needed. As another example, degradation of the circuit over its operation can result in a fault. A trigger, at block 110, may no longer cause any action such as the preliminary period, for example. The fault can be detected manually or based on built-in checks. When a fault is detected, the CSW is made to provide an "on" signal to block 150 at all times.

Figure 2:
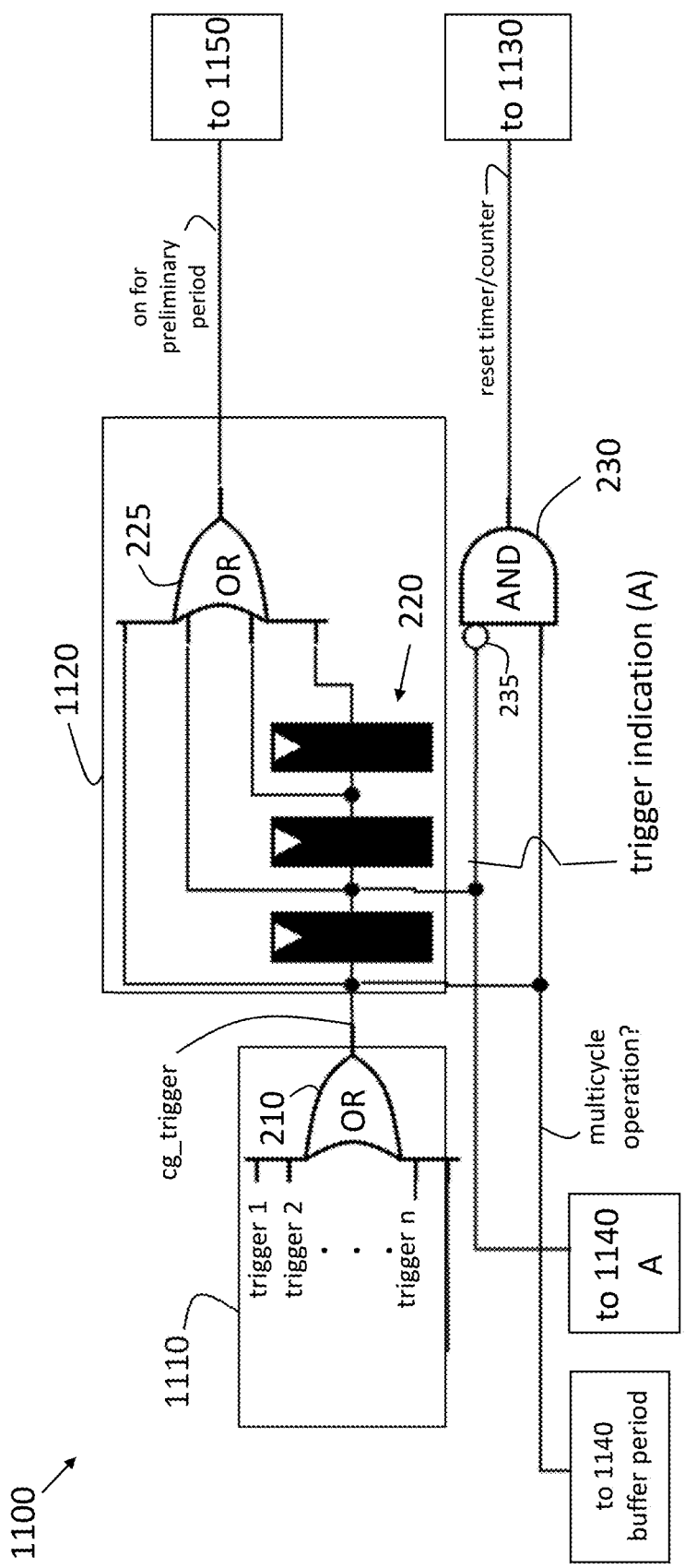
Figure 3:
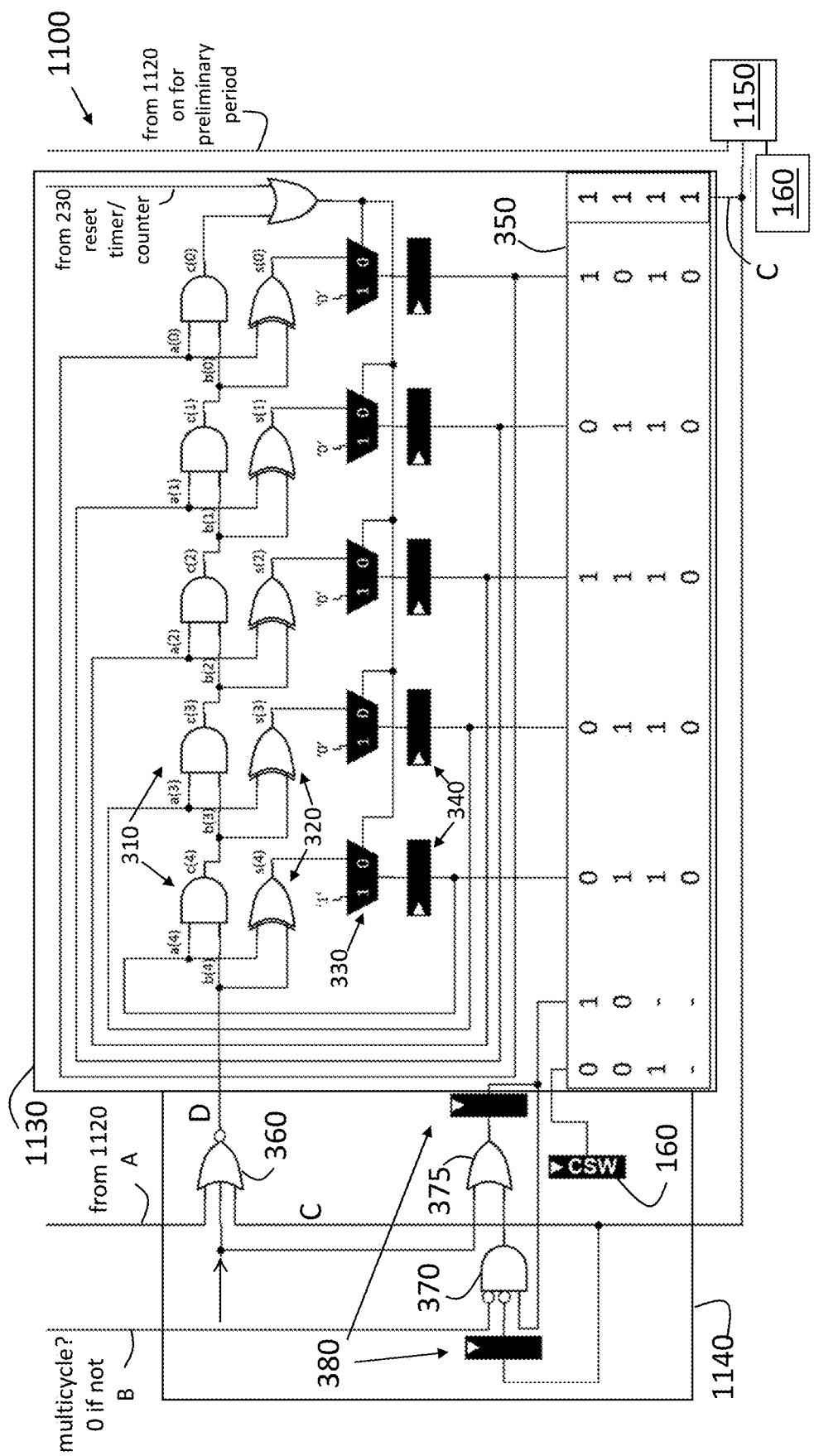
Figure 4:
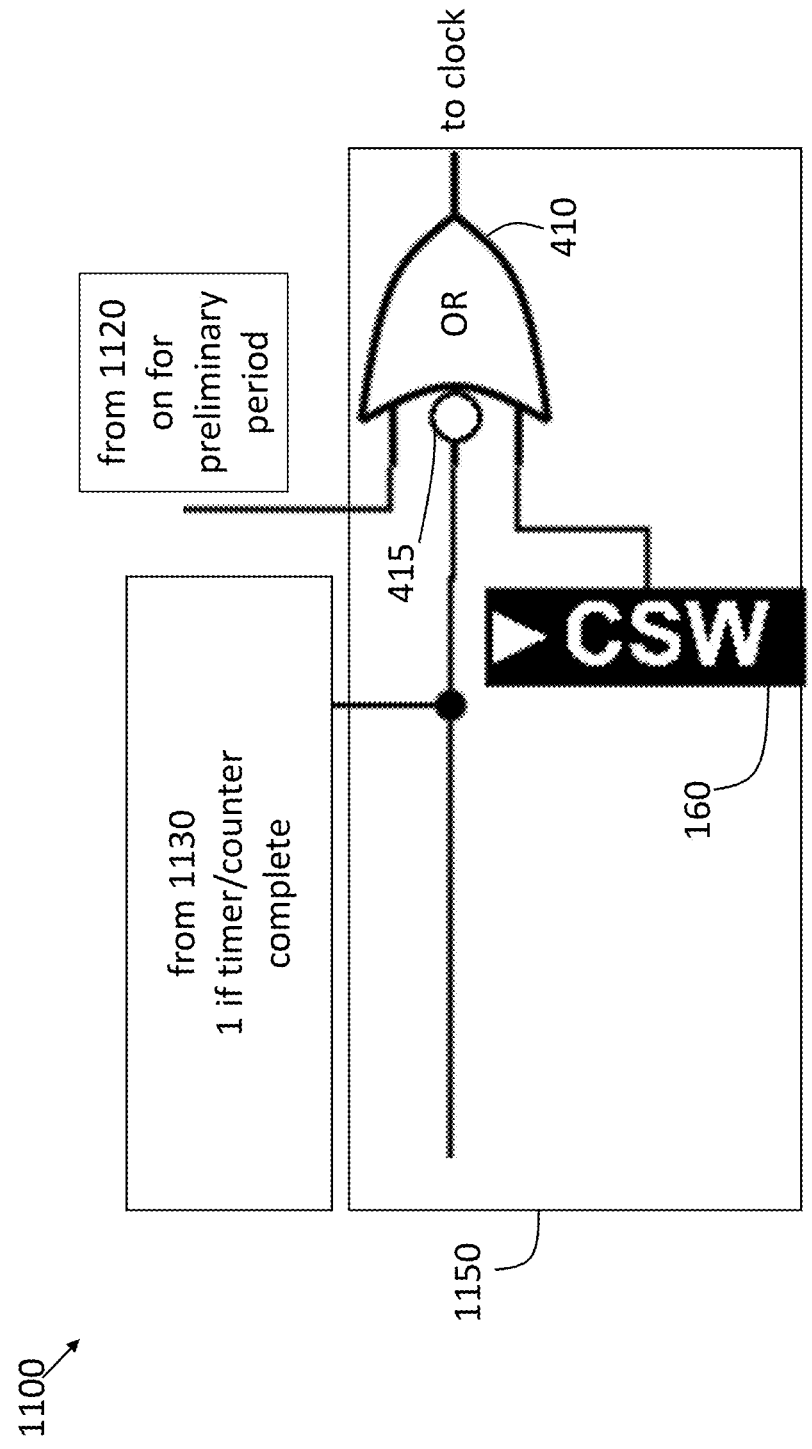

FIGS. 2-4 detail aspects of an exemplary clock gating circuit 1100 that implements the process flow 100 shown in FIG. 1. FIG. 2 details an exemplary circuit 1100 that includes a trigger module 1110 to implement the triggering, at block 110, and a preliminary module 1120 to implement the setting of the preliminary clock gate period, at block 120, as discussed with reference to FIG. 1. As shown, a number of trigger signals (trigger 1 through trigger n) can be input to an OR gate 210 in the trigger module 1110. Any one of the trigger signals being on (i.e., signal having a rising edge) results in a clock gate trigger cg_trigger being provided to the preliminary module 1120 for initiation of a preliminary clock gate period as discussed with reference to block 120. The exemplary implementation of the preliminary module 1120 involves a chain of three flip-flops 220 connected to an OR gate 225 that result in a preliminary clock gate period of three clock cycles being indicated to the clock activation and deactivation module 1150 (FIG. 5) for activation of the clock as discussed with reference to block 150. According to alternate embodiments, a different number of flip-flops 220 can be used in the preliminary module 1120 to set a different preliminary clock gate period.

As FIG. 2 indicates, after one flip-flop 220 (i.e., after one clock cycle), a trigger indication is provided to the dynamic extension module 1140 (FIG. 3) implementing the functionality discussed with reference to block 140. Specifically, the trigger indication is item A (no active triggers) in block 140 in FIG. 1. That is, one clock cycle after the falling edge of the clock gate trigger cg_trigger, there are no active (i.e., high) trigger signals unless another trigger signal is provided to the trigger module 1110. The purpose of obtaining the trigger indication (A) after one flip-flop 220 (i.e., the purpose of the delay) is to reduce the combinational path between the origin of the trigger indication (A) in the preliminary module 1120 and a flip-flop 340 (FIG. 3) in the count and encode module 1130 to thereby facilitate a higher clock rate of the clock gating circuit 1100. In the exemplary implementation, the trigger indication (A) is 1 when there are no active triggers. As FIG. 2 also indicates, if the clock gate trigger cg_trigger is associated with a multi-cycle operation, that information is provided to the buffer period determination portion of the dynamic extension module 1140 that implements the functions of block 140.

The trigger indication (i.e., indication of no active triggers, item A in block 140) is also provided to an inverter 235 of an AND gate 230. As previously noted, the trigger indication is 1 when there are no active triggers. Thus, a 0 is indicated at the input of the AND gate 230 based on the inverter 235. As FIG. 2 shows, an indication of a multi-cycle operation is also provided to the AND gate 230. When no multi-cycle operation is being performed, the value is 0. Thus, when the AND gate 230 receives a 0 at both inputs, a reset timer/counter signal is provided to a count and encode module 1130 to implement the counter discussed with reference to block 130.

FIG. 3 details an exemplary count and encode module 1130 that implements the functionality providing a timer or counter, at block 130, and an exemplary dynamic extension module 1140 that implements the dynamically extending the clock, at block 140, as discussed with reference to FIG. 1. The exemplary count and encode module 1130 involves a set of five AND gates 310, XOR gates 320, multiplexers (MUXs) 330, and flip-flops 340. The number in the set can be based on the maximum number the counter is expected or required to reach. As indicated, a reset signal comes from the AND gate 230 shown in FIG. 2. That is, the counter of the count and encode module 1130 is reset when there is no active trigger (A) and there is no multi-cycle operation being processed.

As indicated, an input D comes from the dynamic extension module 1140 into the count and encode module 1130 from a NOR gate 360. As discussed with reference to FIG. 1, the checks at block 140 can result in a signal (e.g., a run signal) indicating when the timer or counter should continue to run or in a pause signal indicating when the timer or counter should stop running. According to the exemplary implementation of the dynamic extension module 1140, the input D will indicate when the counter of the count and encode module 1130 should run. Conversely, when there is an active trigger (as indicated by A), a multi-cycle operation (as indicated by B), or the counter limit has already been reached (as indicated by C), then the input D indicates that the counter of the count and encode module 1130 should stop.

The first two conditions (active trigger (A) or multi-cycle operation (B)) result in the count and encode module 1130 continuing to indicate to the clock activation and deactivation module 1150 that the clock should stay active. Thus, the input D can dynamically extend the initially set counter limit. As FIG. 3 shows, a look-up table (LUT) 350 is part of the count and encode module 1130. The LUT 350 acts as an interface between the clock and encode module 1130 and the clock activation and deactivation module 1150 by encoding the information provided to the clock activation and deactivation module 1150. For example, when the counter limit is reached, the LUT 350 is the component that provides the indication C to the dynamic extension module 1140 and to the clock activation and deactivation module 1150, as shown. As noted with regard to the input D, the counter limit being reached (indication C) is also a condition that stops the counter of the count and encode module 1130.

The buffer period noted with reference to FIG. 1 can also result from the interaction between the dynamic extension module 1140 and the count and encode module 1130. Specifically, the flip-flops 380, AND gate 370, and OR gate 375 provide a signal to the LUT 350 that causes the count and encode module 1130 to output a signal to the clock activation and deactivation module 1150 to keep the clock active for the specified buffer period. A CSW 160 also provides input to the LUT 350, as shown. This CSW 160 is additional to the CSW 160 that acts as an override and provides input directly to the clock activation and deactivation module 1150, as shown. CSW 160 refers to a scan-only latch that has no data input but can be initialized via a scan chain. The CSW 160 acts as a quasi-static constant value during operation of the clock gate circuit 1100. The value can be re-initialized during operation. For example, as previously noted, degradation of the circuit 1100 over its operation may require changing the value that the CSW 160 provides directly to the clock activation and deactivation module 1150.

FIG. 4 details an exemplary clock activation and deactivation module 1150 that implements the clock activation and deactivation discussed with reference to block 150 of FIG. 1. As shown, three inputs are provided to an OR gate 410. One input is from the preliminary module 1120. This input is on (1) for the preliminary period and off (0) at other times. A second input is from the count and encode module 1130 or, more specifically, from the LUT 350. Because this input goes to an inverter 415, it is 1 when the counter has reached its limit or a buffer period after the counter has reached its limit is completed and is 0 otherwise. A third input is from CSW 160 and is 1 when there is a fault in the clock gate circuit 1100 that requires the clock to remain on at all times. Any one of the three inputs being on (1), which in the case of the second input means the input being 0, will cause the OR gate 410 to provide a signal to activate the clock.

FIG. 5 is a block diagram of a processor 10 that includes the exemplary clock gating circuit 1100 according to one or more embodiments of the invention. As previously noted, the processor 10 can include a number of portions 15 that are driven by their own clocks (clk). The clock gating circuit 1100 or alternative embodiments implementing the process flow 100 according to one or more embodiments of the invention can control the clock clk of one of the portions 15 (e.g., VFU, FXU). The portion 15 includes components like logic gates, buffers, flip-flops, and the like to perform operations of the processor 10. Any one of the modules discussed with reference to FIGS. 2 to 4 may be modified without changing the fault-tolerant gating functionality discussed with reference to FIG. 1. As previously noted, the fault-tolerant gating facilitates greater control over the clock gating process such that the clock is deactivated to save power but not at the expense of operation of the processor 10.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describe having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A method, comprising:
  obtaining a trigger signal directed to a component in a subset of components of an electronic circuit;
  activating a clock corresponding with the subset of components of the electronic circuit for a preliminary period in response to the trigger signal;

determining an active period based on the trigger signal, wherein the clock remains active for the active period;

initiating one of a timer or counter for the active period, wherein a limit is defined for the one of the timer or counter;

dynamically extending the active period for a busy period after the one of the timer or counter is initiated; and deactivating the clock following the active period.

2. The method according to claim 1, further comprising initiating or extending the active period based on a switch that indicates a fault in the clock gating.

3. The method according to claim 2, wherein the initiating or extending the active period includes ensuring that the clock remains active.

4. The method according to claim 1, further comprising setting a buffer period such that the clock remains active for the buffer period after termination of the active phase.

5. The method according to claim 4, wherein the setting the buffer period is based on the busy period resulting from a multi-cycle operation.

6. The method according to claim 1, wherein the dynamically extending the active period for the busy period is based on an additional trigger signal being directed to the subset of components of the electronic circuit.

7. The method according to claim 1, wherein the dynamically extending the active period for the busy period is based on executing a multi-cycle operation.

8. The method according to claim 1, wherein the dynamically extending the active period for the busy period is based on the one of the timer or counter not yet reaching the limit.

9. A processor, comprising:

a portion including a clock;

a clock gate circuit configured to control activation of the clock, the clock gate circuit configured to set one of a timer or counter for a specified period to activate the clock for the specified period based on a trigger signal and to dynamically extend the specified period for a busy period, during tolling of the specified period, based on one or more conditions.

10. The processor according to claim 9, wherein the clock gate circuit includes a trigger module with an OR gate configured to receive the trigger signal as one of a plurality of predefined triggers and a preliminary module with one or more flip-flops configured to activate the clock for a preliminary period prior to the setting of the one of the timer or counter.

11. The processor according to claim 9, wherein the clock gate circuit includes a count and encode module with a look-up table configured to output a binary code to activate the clock for the specified period and the busy period.

12. The processor according to claim 9, wherein the clock gate circuit includes a dynamic extension module configured to determine the busy period based on execution of a multi-cycle operation by the processor.

13. The processor according to claim 9, wherein the one or more conditions include another trigger signal being received by the clock gate circuit.

14. The processor according to claim 9, wherein the one or more conditions include a multi-cycle operation being executed by the portion of the processor.

15. The processor according to claim 9, wherein the one or more conditions include the specified period not being completed.

16. A clock gating circuit in a processor, comprising:

a count and encode module configured to set one of a timer or counter for a specified period to activate the clock for the specified period based on a trigger signal; and a dynamic extension module configured to dynamically extend the specified period for a busy period, during tolling of the specified period, based on one or more conditions.

17. The clock gating circuit according to claim 16, further comprising a preliminary module configured to activate the clock for a preliminary period prior to initiation of the one of the timer or counter for the specified period.

18. The clock gating circuit according to claim 16, further comprising a trigger module with an OR gate configured to receive the trigger signal as one of a plurality of predefined triggers.

19. The clock gating circuit according to claim 16, wherein the count and encode module includes a look-up table configured to output a binary code to activate the clock for the specified period and the busy period.

20. The clock gating circuit according to claim 16, wherein the one or more conditions include another trigger signal being received by the clock gate circuit, a multi-cycle operation being executed by the processor, and the specified period not being completed.

* * * * *